United States Patent
Tsui

(10) Patent No.: US 6,607,945 B2
(45) Date of Patent: Aug. 19, 2003

(54) LASER-ASSISTED SILICIDE FUSE PROGRAMMING

(75) Inventor: Ting Yiu Tsui, Dallas, TX (US)

(73) Assignee: Advanced Micro Devices, Inc., Austin, TX (US)

(*) Notice: Subject to any disclaimer, the term of this patent is extended or adjusted under 35 U.S.C. 154(b) by 113 days.

(21) Appl. No.: 09/864,755

(22) Filed: May 24, 2001

(65) Prior Publication Data

US 2002/0192879 A1 Dec. 19, 2002

(51) Int. Cl.[7] .............................................. H01L 21/82
(52) U.S. Cl. ....................................................... 438/132
(58) Field of Search ................................. 438/128, 131, 438/132

(56) References Cited

U.S. PATENT DOCUMENTS 4,535,219 A * 8/1985 Sliwa, Jr. ............... 219/121.14
5,389,814 A * 2/1995 Srikrishnan et al. ........ 257/529

* cited by examiner

Primary Examiner—Evan Pert
(74) Attorney, Agent, or Firm—Williams, Morgan & Amerson

(57) ABSTRACT

A method is provided, the method comprising programming a silicide fuse by passing a current through the silicide fuse while substantially simultaneously irradiating the silicide fuse with a laser.

34 Claims, 2 Drawing Sheets

LASER-ASSISTED SILICIDE FUSE PROGRAMMING

BACKGROUND OF THE INVENTION

1. Field of the Invention

This invention relates generally to semiconductor fabrication technology and, more particularly, to techniques for programming semiconductor devices.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the channel length of a transistor also requires reducing the size and area of electrical contacts to active areas, such as $N^+$ $(P^+)$ source/drain regions and a doped-polycrystalline silicon (doped-polysilicon or doped-poly) gate conductor. As the size and area of the electrical contacts to the active areas get smaller, the active area contact resistance increases. Increased active area contact resistance is undesirable for a number of reasons. For example, increased active area contact resistance may reduce device drive current, and source/drain current through the device, and may also adversely affect the overall speed and operation of the transistor.

Typically, depositing titanium (Ti) or cobalt (Co) on the active area electrical contacts may decrease active area contact resistance. The Ti may then be silicided by annealing with a heat-treatment to form titanium silicide ($TiSi_2$) at the active area electrical contacts (self-aligned silicidation or salicidation). The salicided $TiSi_2$ lowers active area contact resistance.

Silicide fuses may also be formed between semiconductor devices. Typically, when the circuit design and/or layout for the various semiconductor devices has been decided, appropriate ones of the silicide fuses between the respective semiconductor devices may be "blown" to separate electrically the appropriate semiconductor devices from one another. During programming of conventional silicide fuses, a relatively high voltage of about 2 V or higher drives a current through the silicide fuses to increase the local temperature in the silicide fuses through Joule heating to induce an irreversible phase transition of the silicide. The temperature required for the irreversible phase transition of the silicide is about 900° C. Under optimized conditions, the new phase produces agglomeration of the silicide and increases the resistance through the silicide fuse by as much as about 20 times the "unblown" resistance.

However, reducing the size, or scale, of the components of typical semiconductor devices, such as field effect transistors, also typically requires reducing the operational voltage of such semiconductor devices. The programming procedure for the silicide fuses between such semiconductor devices, however, becomes much more difficult as the semiconductor device operational voltages, and, consequently, the maximum allowable silicide fuse "blowing" voltages, are reduced to less than about 2 V. Voltages this low typically lead to an incomplete phase transition for the silicide fuses and the resistances may only increase partially, to a range of only about 3–5 times the "unblown" resistances. This resistance increase may not be sufficient for the programming of the silicide fuses and normal device operation.

The present invention is directed to overcoming, or at least reducing the effects of, one or more of the problems set forth above.

SUMMARY OF THE INVENTION

In one aspect of the present invention, a method is provided, the method comprising programming a silicide fuse by passing a current through the silicide fuse while substantially simultaneously irradiating the silicide fuse with a laser.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
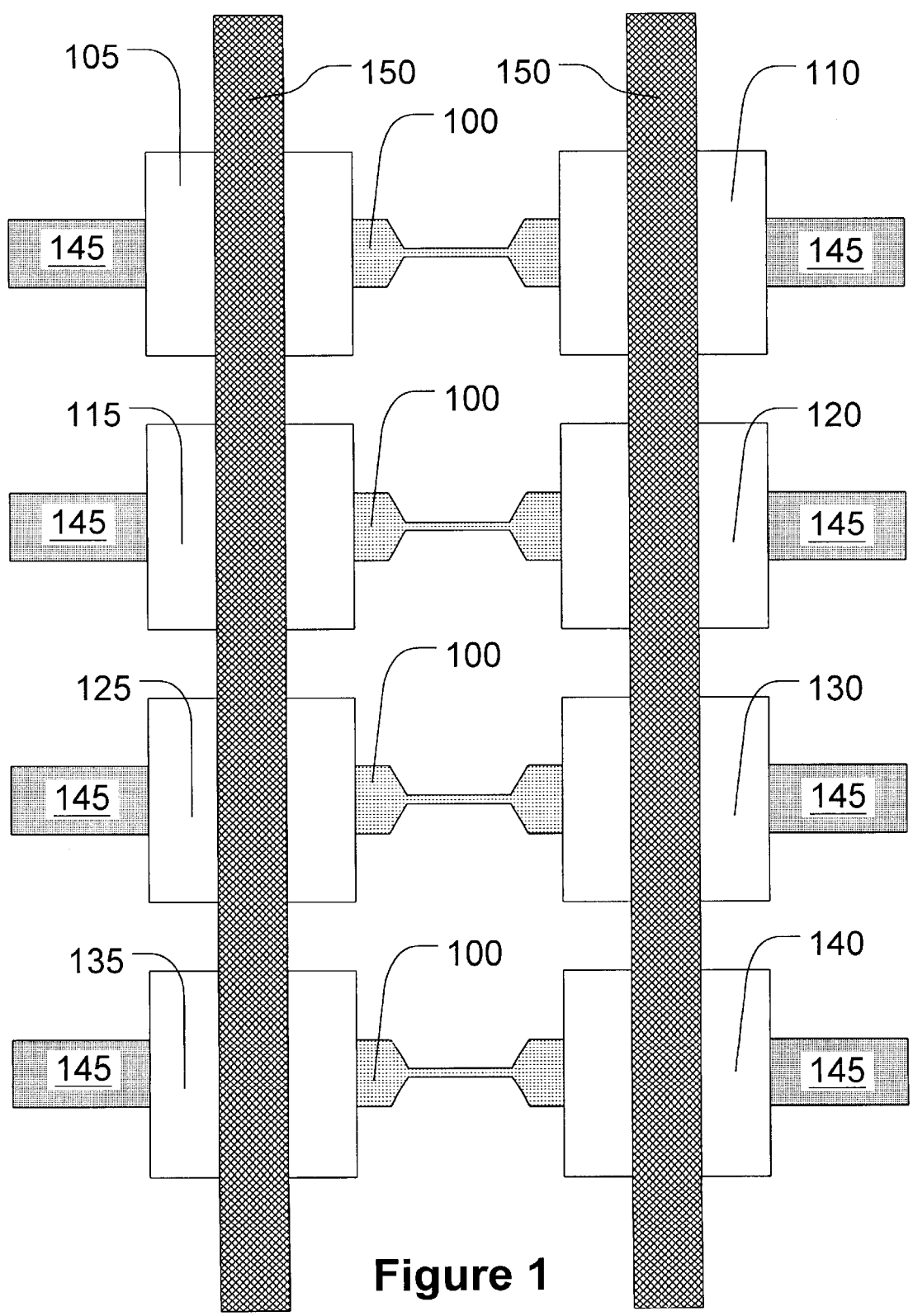
FIG. 1 schematically illustrates a plurality of silicide fuses between a plurality of semiconductor devices before a programming procedure has "blown" any of the silicide fuses.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
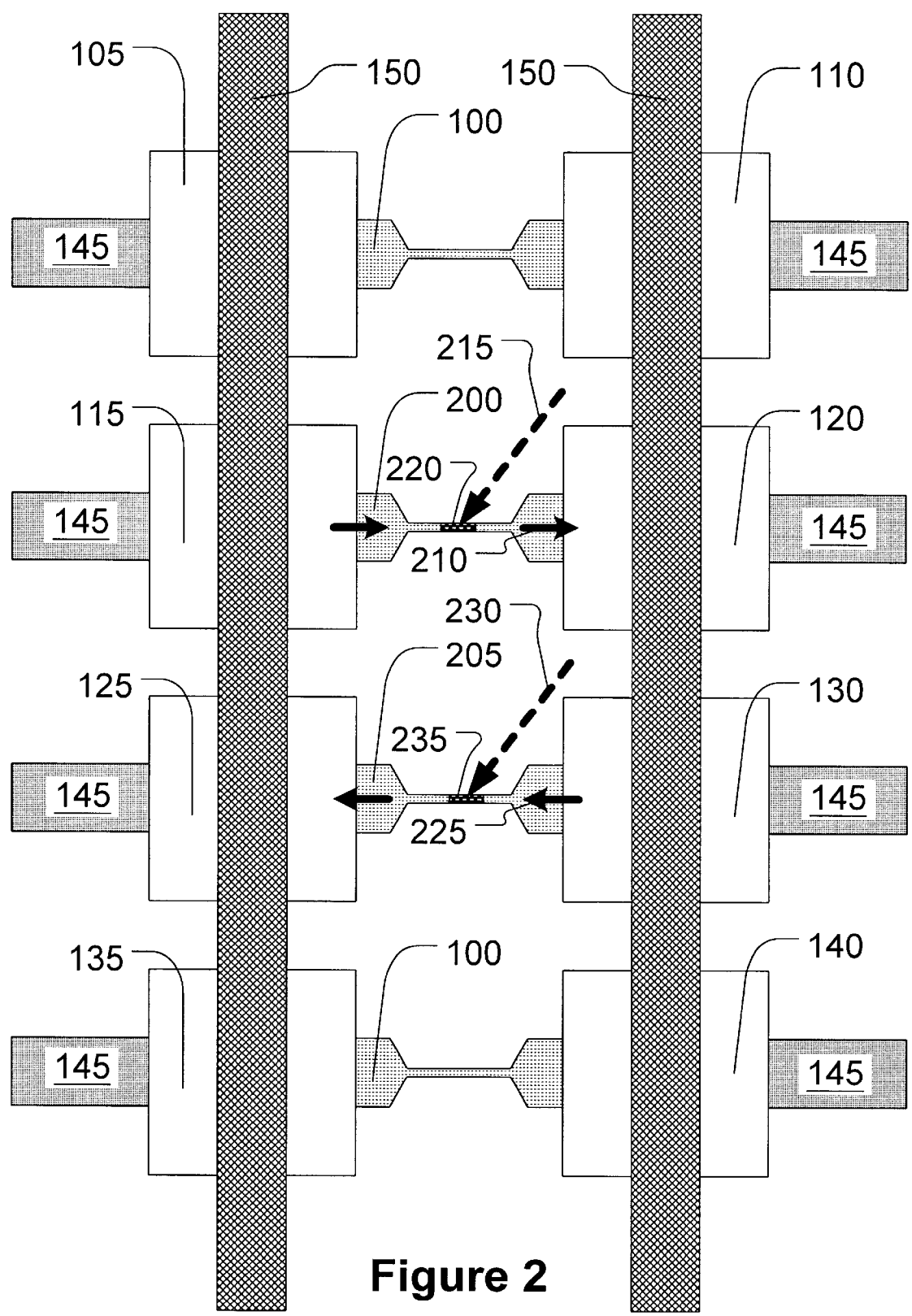
FIG. 2 schematically illustrates the plurality of silicide fuses between the plurality of semiconductor devices as shown in FIG. 1 after a programming procedure has "blown" at least one of the silicide fuses.

Illustrative embodiments of a method for semiconductor device fabrication according to the present invention are shown in FIGS. 1–2. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

As shown in FIG. 1, a plurality of silicide fuses 100 may be disposed between a plurality of semiconductor devices 105, 110, 115, 120, 125, 130, 135 and 140. For example, the plurality of semiconductor devices 105, 110, 115, 120, 125, 130, 135 and 140 may be metal-oxide silicon (MOS) field effect transistors (FETs) forming a portion of a dynamic random access memory (DRAM) array. The plurality of semiconductor devices 105, 110, 115, 120, 125, 130, 135 and 140 may be connected on one side to first lines 145, such as bit lines. In addition, the plurality of semiconductor devices 105, 110, 115, 120, 125, 130, 135 and 140 may be interconnected by second lines 150, such as word lines. As shown in FIG. 1, none of the plurality of silicide fuses 100 are "blown," so that the resistance through each of the plurality of silicide fuses 100 has not been increased by a programming procedure.

As shown in FIG. 2, a programming procedure has "blown" silicide fuses 200 and 205 between the semiconductor devices 115 and 120, and 125 and 130, respectively. This programming procedure has left "unblown" the silicide fuses 100 between the semiconductor devices 105 and 110, and 135 and 140, respectively. Other programming procedures may, of course, leave a different pattern of "blown" and "unblown" silicide fuses 200 and 100 than the pattern as shown in FIG. 2, depending on the appropriate circuit design and/or layout for the various semiconductor devices 105, 110, 115, 120, 125, 130, 135 and 140.

A current 210 is passed through the silicide fuse 200 between the semiconductor devices 115 and 120 while substantially simultaneously the silicide fuse 200 is irradiated (as indicated by phantom arrow 215) by a laser (not shown). In various illustrative embodiments, the current 210 may be a single pulse of about 1.5 V having a width in a range of about 1 microsecond to about 1 second. In one illustrative embodiment, the current 210 is a single pulse of about 1.5 V having a width of about 1 millisecond. The laser may be one or more high intensity lasers and/or may be one or more pulsed lasers. In various illustrative embodiments, one high intensity laser and/or one pulsed laser may be used.

In various illustrative embodiments, the laser spot may cover one or more metal fuses, each of the metal fuses having a width in a range of about 1 micron to about 10 microns. The laser spot may be focused to an ellipse with a semi-major axis of about 5 microns and a semi-minor axis of about 2.5 microns, for example. In various illustrative embodiments, an XRL 525 laser process system may be used that employs a Spectra physics diode-pumped Q-switched Nd:YLF laser (about 1047 nanometers) operated in the saturated single pulse mode, with laser pulses of about 15 nanoseconds (ns) directed through focusing optics and brought to impinge upon the metal fuses. In various illustrative embodiments, a laser energy equal to or greater than about 0.475 microJoules may suffice to make a metal cut of the silicide fuse 200 possible, in conjunction with the current 210 being passed substantially simultaneously through the silicide fuse 200. In various alternative illustrative embodiments, a laser energy equal to or greater than about 0.875 MicroJoules may suffice as a cut energy threshold to make a metal cut of the silicide fuse 200 possible, in conjunction with the current 210 being passed substantially simultaneously through the silicide fuse 200. In various other alternative illustrative embodiments, the laser energy may be greater than about 0.875 MicroJoules so that substantially all of the cuts are made successfully. In various illustrative embodiments, an increase in the laser energy above about 1.6 MicroJoules may result in cracks forming in an underlying process layer at one or more of the corners of the silicide fuse 200.

Irradiation by a high intensity and/or pulsed laser for a time period of about 0.5 seconds generates enough heat to melt aluminum (Al) and/or copper (Cu) metal fuses, creating an opening in the aluminum (Al) and/or copper (Cu) metal fuses, for example. The silicide fuse 200 may be irradiated (as indicated by phantom arrow 215) by the pulsed laser for a time period in a range of about 1 microsecond to about 2 seconds.

The current 210 is passed through the silicide fuse 200 between the semiconductor devices 115 and 120 while the silicide fuse 200 is subjected to a voltage of about 2 V or less. Local heating of a portion 220 of the silicide fuse 200 by the laser irradiation 215 and by the Joule heating by the current 210 increases the local temperature of the portion 220 of the silicide fuse 200 to about 900° C. This is sufficient to induce an irreversible phase transition of the portion 220 of the silicide fuse 200. Under optimized conditions, the new phase produces agglomeration of the silicide and increases the resistance through the silicide fuse 200 by as much as about 20 times the "unblown" resistance.

Similarly, a current 225 is passed through the silicide fuse 205 between the semiconductor devices 125 and 130 while substantially simultaneously the silicide fuse 205 is irradiated (as indicated by phantom arrow 230) by a laser (not shown). As shown in FIG. 2, the direction of the current 225 may be opposite to the direction of the current 210. In various alternative embodiments (not shown) the direction of the current 225 may be the same as the direction of the current 210. The silicide fuse 205 may be irradiated (as indicated by phantom arrow 230) by the pulsed laser for a time period in a range of about 1 microsecond to about 2 seconds.

The current 225 is passed through the silicide fuse 205 between the semiconductor devices 125 and 130 while the silicide fuse 205 is subjected to a voltage of about 2 V or less. Local heating of a portion 235 of the silicide fuse 205 by the laser irradiation 230 and by the Joule heating by the current 225 increases the local temperature of the portion 235 of the silicide fuse 205 to about 900° C. This is sufficient to induce an irreversible phase transition of the portion 235 of the silicide fuse 205. Under optimized conditions, the new phase produces agglomeration of the silicide and increases the resistance through the silicide fuse 205 by as much as about 20 times the "unblown" resistance.

Any of the above-disclosed embodiments of a method of programming silicide fuses enables the programming procedure for the silicide fuses between semiconductor devices to be efficacious, even as the semiconductor device operational voltages, and, consequently, the maximum allowable silicide fuse "blowing" voltages, are reduced to less than about 2 V. However, the method described herein may find application in semiconductor devices with higher operational voltages. Local heating of portions of the silicide fuses by laser irradiation and by Joule heating by the currents increases the local temperature of the portions of the silicide fuses to about 900° C. This is sufficient to induce an irreversible phase transition of the portions of the silicide fuses. Under optimized conditions, the new phase produces agglomeration of the silicide and increases the resistance through the silicide fuses by as much as about 20 times the "unblown" resistance. Any of the above-disclosed embodiments of a method of programming silicide fuses according to the present invention provides a new function in semiconductor processing, and improves reliability, precision, accuracy and efficiency.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed:

1. A method comprising:
    programming a silicide fuse by passing a current through the silicide fuse while substantially simultaneously irradiating the silicide fuse with a laser.
2. The method of claim 1, wherein passing the current through the silicide fuse comprises subjecting the silicide fuse to a voltage of no more than about 2 V.
3. The method of claim 1, wherein irradiating the suicide fuse with the laser comprises irradiating the suicide fuse with a laser energy substantially equal to or greater than about 0.475 microJoules.
4. The method of claim 2, wherein irradiating the suicide fuse with the laser comprises irradiating the silicide fuse with a laser energy substantially equal to or greater than about 0.475 microJoules.
5. The method of claim 1, wherein irradiating the silicide fuse with the laser comprises irradiating the silicide fuse with a pulsed laser.
6. The method of claim 5, wherein irradiating the silicide fuse with the pulsed laser comprises irradiating the silicide fuse with the pulsed laser for a time period in a range of about 1 microsecond to about 2 seconds.
7. The method of claim 2, wherein irradiating the silicide fuse with the laser comprises irradiating the silicide fuse with a pulsed laser.
8. The method of claim 7, wherein irradiating the silicide fuse with the pulsed laser comprises irradiating the silicide fuse with the pulsed laser for a time period in a range of about 1 microsecond to about 2 seconds.
9. The method of claim 3, wherein irradiating the silicide fuse with the laser energy substantially equal to or greater than about 0.475 microJoules comprises irradiating the silicide fuse with a pulsed laser capable of providing a laser energy substantially equal to or greater than about 0.475 microJoules.
10. The method of claim 9, wherein irradiating the silicide fuse with the pulsed laser comprises irradiating the silicide fuse with the pulsed laser capable of providing the laser energy substantially equal to or greater than about 0.475 microJoules for a time period in a range of about 1 microsecond to about 2 seconds.
11. A method comprising:
    programming a plurality of silicide fuses by passing a current through at least one of the plurality of silicide fuses while substantially simultaneously irradiating the at least one of the plurality of silicide fuses with a laser.
12. The method of claim 11, wherein passing the current through the at least one of the plurality of silicide fuses comprises subjecting the at least one of the plurality of silicide fuses to a voltage of no more than about 2 V.
13. The method of claim 11, wherein irradiating the at least one of the plurality of silicide fuses with the laser comprises irradiating the at least one of the plurality of suicide fuses with a laser energy substantially equal to or greater than about 0.475 microJoules and substantially equal to or less than 1.6 microJoules.
14. The method of claim 12, wherein irradiating the at least one of the plurality of silicide fuses with the laser comprises irradiating the at least one of the plurality of silicide fuses with a laser energy substantially equal to or greater than about 0.475 microJoules and substantially equal to or less than 1.6 microJoules.
15. The method of claim 11, wherein irradiating the at least one of the plurality of silicide fuses with the laser comprises irradiating the at least one of the plurality of silicide fuses with a pulsed laser.
16. The method of claim 15, wherein irradiating the at least one of the plurality of silicide fuses with the pulsed laser comprises irradiating the at least one of the plurality of silicide fuses with the pulsed laser for a time period in a range of about 1 microsecond to about 2 seconds.
17. The method of claim 12, wherein irradiating the at least one of the plurality of silicide fuses with the laser comprises irradiating the at least one of the plurality of silicide fuses with a pulsed laser.
18. The method of claim 17, wherein irradiating the at least one of the plurality of silicide fuses with the pulsed laser comprises irradiating the at least one of the plurality of silicide fuses with the pulsed laser for a time period in a range of about 1 microsecond to about 2 seconds.
19. The method of claim 13, wherein irradiating the at least one of the plurality of silicide fuses with the laser energy substantially equal to or greater than about 0.475 microJoules and substantially equal to or less than 1.6 microJoules comprises irradiating the at least one of the plurality of silicide fuses with a pulsed laser capable of providing a laser energy substantially equal to or greater than about 0.475 microJoules and substantially equal to or less than 1.6 microJoules.
20. The method of claim 19, wherein irradiating the at least one of the plurality of silicide fuses with the pulsed laser comprises irradiating the at least one of the plurality of silicide fuses with the pulsed laser for a time period in a range of about 1 microsecond to about 2 seconds.
21. A method comprising:
    forming a plurality of semiconductor devices;
    forming a plurality of silicide fuses between at least some of the plurality of semiconductor devices; and programming the plurality of silicide fuses by passing a current through at least one of the plurality of silicide fuses while substantially simultaneously irradiating the at least one of the plurality of silicide fuses with a laser.

22. The method of claim 21, wherein passing the current through the at least one of the plurality of silicide fuses comprises subjecting the at least one of the plurality of silicide fuses to a voltage of no more than about 2 V.

23. The method of claim 21, wherein irradiating the at least one of the plurality of suicide fuses with the laser comprises irradiating the at least one of the plurality of suicide fuses with a laser energy substantially equal to or greater than about 0.475 microJoules and substantially equal to or less than 1.6 microJoules.

24. The method of claim 22, wherein irradiating the at least one of the plurality of suicide fuses with the laser comprises irradiating the at least one of the plurality of silicide fuses with a laser energy substantially equal to or greater than about 0.475 microJoules and substantially equal to or less than 1.6 microJoules.

25. The method of claim 21, wherein irradiating the at least one of the plurality of silicide fuses with the laser comprises irradiating the at least one of the plurality of silicide fuses with a pulsed laser.

26. The method of claim 25, wherein irradiating the at least one of the plurality of silicide fuses with the pulsed laser comprises irradiating the at least one of the plurality of silicide fuses with the pulsed laser for a time period in a range of about 1 microsecond to about 2 seconds.

27. The method of claim 22, wherein irradiating the at least one of the plurality of silicide fuses with the laser comprises irradiating the at least one of the plurality of silicide fuses with a pulsed laser.

28. The method of claim 27, wherein irradiating the at least one of the plurality of silicide fuses with the pulsed laser comprises irradiating the at least one of the plurality of silicide fuses with the pulsed laser for a time period in a range of about 1 microsecond to about 2 seconds.

29. The method of claim 23, wherein irradiating the at least one of the plurality of silicide fuses with the laser comprises irradiating the at least one of the plurality of silicide fuses with a pulsed laser capable of providing a laser energy substantially equal to or greater than about 0.475 microJoules and substantially equal to or less than 1.6 microJoules.

30. The method of claim 29, wherein irradiating the at least one of the plurality of suicide fuses with the pulsed laser comprises irradiating the at least one of the plurality of silicide fuses with the pulsed laser for a time period in a range of about 1 microsecond to about 2 seconds.

31. The method of claim 3, wherein irradiating the silicide fuse with the laser energy substantially equal to or greater than about 0.475 microJoules further comprises irradiating the silicide fuse with the laser energy substantially equal to or less than 1.6 microJoules.

32. The method of claim 4, wherein irradiating the suicide fuse with the laser energy substantially equal to or greater than about 0.475 microJoules further comprises irradiating the silicide fuse with the laser energy substantially equal to or less than 1.6 microJoules.

33. The method of claim 9, wherein irradiating the silicide fuse with a pulsed laser capable of providing the laser energy substantially equal to or greater than about 0.475 microJoules further comprises irradiating the silicide fuse with a pulsed laser capable of providing the laser energy substantially equal to or less than 1.6 microJoules.

34. The method of claim 10, wherein irradiating the silicide fuse with the pulsed laser capable of providing the laser energy substantially equal to or greater than about 0.475 microJoules for a time period in a range of about 1 microsecond to about 2 seconds further comprises irradiating the silicide fuse with the pulsed laser capable of providing the laser energy substantially equal to or less than 1.6 microJoules for a time period in a range of about 1 microsecond to about 2 seconds.

* * * * *